(12) United States Patent
Mendel et al.

(10) Patent No.: US 8,408,277 B2
(45) Date of Patent: Apr. 2, 2013

(54) METHOD AND APPARATUS FOR PRODUCTION OF ROTATABLE SPUTTERING TARGETS

(76) Inventors: Anthony Mendel, Middlesex, NJ (US); George E. Whalen, Middlesex, NJ (US)

( * ) Notice: Subject to any disclaimer, the term of this patent is extended or adjusted under 35 U.S.C. 154(b) by 0 days.

(21) Appl. No.: 13/501,358

(22) PCT Filed: Oct. 12, 2010

(86) PCT No.: PCT/EP2010/065257
§ 371 (c)(1),
(2), (4) Date: Apr. 12, 2012

(87) PCT Pub. No.: WO2011/045304
PCT Pub. Date: Apr. 21, 2011

(65) Prior Publication Data
US 2012/0186770 A1   Jul. 26, 2012

(30) Foreign Application Priority Data

Oct. 12, 2009 (LU) .......................................... 91 615
Dec. 30, 2009 (LU) .......................................... 91 635

(51) Int. Cl.
*B22D 19/16* (2006.01)
(52) U.S. Cl. ............................. 164/94; 164/98; 164/332
(58) Field of Classification Search ................. 164/91, 164/94–96, 98–100, 103, 332
See application file for complete search history.

(56) References Cited

U.S. PATENT DOCUMENTS

| | | | |
|---|---|---|---|
| 3,669,179 A * | 6/1972 | Federman | 164/461 |
| 4,108,235 A * | 8/1978 | Paton et al. | 164/515 |
| 5,354,446 A | 10/1994 | Kida et al. | |
| 6,719,034 B2 | 4/2004 | Heck et al. | |
| 7,024,750 B2 * | 4/2006 | Isokyto et al. | 29/527.7 |
| 2005/0092455 A1 * | 5/2005 | Weigert et al. | 164/6 |

FOREIGN PATENT DOCUMENTS

EP       1186682 A2     3/2002
JP    05220566 A   *    8/1993

OTHER PUBLICATIONS

International Search Report; International Application No. PCT/EP2010/065257; International Filing Date Oct. 12, 2010; Mail date Feb. 2, 2011.

* cited by examiner

*Primary Examiner* — Kevin P Kerns
*Assistant Examiner* — Kevin E Yoon
(74) *Attorney, Agent, or Firm* — Cantor Colburn LLP

(57) ABSTRACT

The present invention relates to a method and apparatus for producing rotatable sputtering targets by means of continuous casting. Target material is deposited around a cylindrical target holder (14) by means of a movable mold (30) surrounding the target holder. The mold (30) is fed with molten metal while it is translated along the target holder to progressively form the layer of molten metal on the outer surface of the target holder.

20 Claims, 2 Drawing Sheets

METHOD AND APPARATUS FOR PRODUCTION OF ROTATABLE SPUTTERING TARGETS

TECHNICAL FIELD

The present invention generally relates to the production of rotatable sputtering targets.

BRIEF DISCUSSION OF RELATED ART

Magnetron sputtering technology is now largely used to produce thin films for the thin film coating industry. For example, this technology is used in the glass industry to produce low emission coatings on glass panes to improve the thermal properties of the glass.

As it is well known, sputtering is a process whereby atoms are ejected from a solid target material (i.e. the material to be deposited on the substrate to be coated) due to bombardment of the target by energetic ions. The process is conventionally carried out under vacuum and a plasma is created. An electric discharge necessary for sputtering is produced by polarising the target negatively in relation to the frame of the reactor. The magnets arranged underneath the target keep the plasma close to the target. The material of the targets is removed forcibly and deposited on the substrate, e.g. glass panes. The thickness of the coatings generally varies between 10 and 500 nm.

To improve the productivity of magnetron sputtering, tube-shaped targets or rotatable targets are progressively replacing the planar targets, since they allow higher erosion rates in the sputtering process. These tube-shaped targets are also more efficient for the reactive sputtering process to coat thin oxide layers.

A variety of materials can be deposited by magnetron sputtering, which implies a lot of different target materials. The use of a tube shaped sputtering target may require some particular precaution, depending on the mechanical and thermal properties of the material to be deposited. For instance, some metals used in the sputtering process are subject to creep even at room temperature or at slightly elevated temperatures that prevail during the sputtering process due to low melting point of metals or of alloys. To prevent creep deformation of metals or alloys, it is known to support the target material on an inner tube consisting of a material with better mechanical behaviour (e.g. stainless steel) that is cooled during the sputtering process.

U.S. Pat. No. 5,354,446 describes various production processes for tube-shaped targets with an inner, support tube or target holder and an outer tube or target tube made of soft, low-melting or fracture-susceptible metals or alloys. In one of these processes, the outer tube is applied to the inner tube by thermal spraying. In another process, an outer tube of target material is formed and joined to the inner tube with indium solder. Furthermore, the patent describes the use of adhesion-improving coatings between the inner and outer tubes, which allow adaptation of the different coefficients of thermal expansion of the inner and outer tubes. A process is also described in which the outer tube is applied to the inner tube by hot isostatic pressing. The cited processes are expensive, labor-intensive and problematic. For example, the full-surface joining of the inner and outer tubes by soldering is generally difficult due to their non-perfect geometries. The soldering process turns out to be especially difficult, since the melting points of the outer tube of target material and the solder often fall within very similar ranges. Forming the outer tube by thermal spraying causes irregularities in the structure of the outer tube of target material. On the one hand, these irregularities are caused by gas inclusions in the form of pores, gas inclusions in dissolved form, or inclusions of oxide particles in sprayed metallic coatings. On the other hand, the necessity of applying the outer tube in layers due to the thermal spraying process results in a non-uniform structure of shells building-up the outer tube, which leads to a poor adhesion to the inner tube. These types of structural problems of the outer, target tube is responsible for non-uniform deposition rates during the cathode sputtering process. Gas inclusions in pores can lead to deflagration and material spalling, since the sputtering is carried out under vacuum. Oxygen dissolved in the structure affects the stoichiometry and makes it difficult to control the process for oxide deposition.

U.S. Pat. No. 6,719,034 describes a process of casting a low-melting point tube shaped target. The outer tube is cast in a heated, vertical, cylindrical permanent mould, the inner tube forming a heated mandrel for the cylindrical mould, whereby after a space between the mould and the inner tube has been filled with the molten target material, a first thermal gradient develops between the inner tube and the mould, and a second thermal gradient develops between the bottom and the top of the mould. The outer tube is simultaneously cooled from the inside to outside and from bottom to top.

While such casting process may appear simple to implement, there may be problems of uniformity with respect to heating and cooling when the length of the inner tube increases. Furthermore, it has been observed that the obtained structure of the target material is quite coarse grained (average grain size of 8 mm) and may vary from the centre to the tube ends.

Another casting process in a permanent mould is described in EP 1 186 682.

BRIEF SUMMARY

The invention provides an improved method of manufacturing rotatable sputtering targets.

The present invention relates to an improved method of manufacturing a rotatable sputtering target, wherein molten target material is cast around a cylindrical target holder in order to form a layer of target material on the outer surface of the target holder. According to an important aspect of the invention, the target material is cast around the target holder by means of a mould surrounding the cylindrical target holder and axially extending over only part of the length thereof, the mould being fed with molten target material while the mould and target holder are moved axially relative to one another so as to progressively form the layer of target material along the target holder.

Hence, the target material is progressively deposited on the outer surface of the cylindrical target holder (forming the support/backing tube); and the target material can be so to speak "continuously" cast around the support tube formed by the target holder.

As it will be understood by those skilled in the art, the present method is preferably carried out with the cylindrical target holder vertically arranged. Also, while the mould may be translated along a fixed cylindrical target holder, a possible alternative is to have the mould fixed and move the target holder, or even move both.

As the target material that has already been cast around a section of the target holder cools and solidifies, a slight contraction of volume occurs, which facilitates the progression of the mould along the target holder.

The present method is simple to implement as compared to the known methods relying on the spraying or welding of target material onto the target holder. Also, the purity of the target material is better controlled by casting than by the spraying technique. Further, gas inclusions can be avoided and a density of up to 100% can be attained.

The present method also proves significantly advantageous over the static casting technique described in U.S. Pat. No. 6,719,034. It avoids the use of a large mould that needs to be pre-heated over the whole length of the support tube. By contrast, in the present method the heating is mainly located at the mould, i.e. a comparatively small volume of mould and target holder is heated. In practice, the present method proves to be faster than the static casting approach, thus improving the productivity and reducing production costs per tube.

A further benefit of the present invention is a better control of the microstructure: a finer grain structure and better homogeneity can be achieved.

Cooling is a factor that also plays on the microstructure. Therefore, the target holder is preferably cooled from the inside. A stream of cooling water of controlled temperature provides a desired temperature gradient through the target holder and cast layer.

The mould may typically comprise a sleeve member having an inside diameter adapted to the desired wall thickness. A cooling circuit may be arranged at the outer periphery of the sleeve member to avoid overheating of the mould. An additional annular cooling device may further be installed below (at the rear) the mould to provide an increased cooling of the solidified, cast layer and thus avoid heating up of the mould; this is advantageous for the casting of long tubes and thus ensures a constant temperature inside the mould.

As the mould extends over a given section of the target holder, one possible approach is a segmented progression, where one section corresponding to the height (axial extent) of the mould is cast and solidified before the mould is moved further.

However, a substantially continuous progression is preferred. Accordingly, in a preferred embodiment the relative movement between mould and target holder is conducted so that the mould progresses along the target holder, and the operating parameters are controlled so that, meanwhile, target material fed to the mould solidifies in the rear (bottom) region of the mould while it remains molten in the front region (close to the feed point of molten metal). The most relevant parameters are: the cooling temperature of the target holder, the axial speed of the mould relative to the target holder; the feed temperature of the molten target metal.

In this connection, feed of molten target material to the mould may be controlled so that the mould is filled to up to about 70 to 90% of its volume, preferably about 80%.

In doing so, segments of small dimensions are formed as compared to the height of the mould, which is preferable for a more homogeneous solidification and to avoid blocking of the mould.

As it will be understood, except for the initial position of the mould where the first volume of molten metal is poured, the progression of the mould is controlled so that the bottom region of the mould overlaps an already solidified portion of target material.

In one embodiment, the mould is connected to a driving structure that permits to coaxially translate the mould along the target holder.

Preferably, the mould is subjected to an additional a cyclic motion. For example, it may undergo an axially reciprocating movement of low speed and frequency with respect to its support element, which thus adds up to the translational speed with respect to the target holder. Alternatively, the mould may be rotated about itself during the casting of target material.

In order to enhance the bonding between the target holder and the target material, the outer surface of the target holder may be pre-treated with a bond enhancing coating before casting of the target material.

After forming of the entire target material layer on the target holder, the former can be machined in order to provide an improved concentricity or to provide a desired axial surface profile (e.g. dog bone shape) of the target material.

According to another aspect of the invention, there is proposed an apparatus for producing a rotatable sputtering target.

BRIEF DESCRIPTION OF THE DRAWINGS

The present invention will now be described, by way of example, with reference to the accompanying drawings, in which.

DETAILED DESCRIPTION

Figure 1:
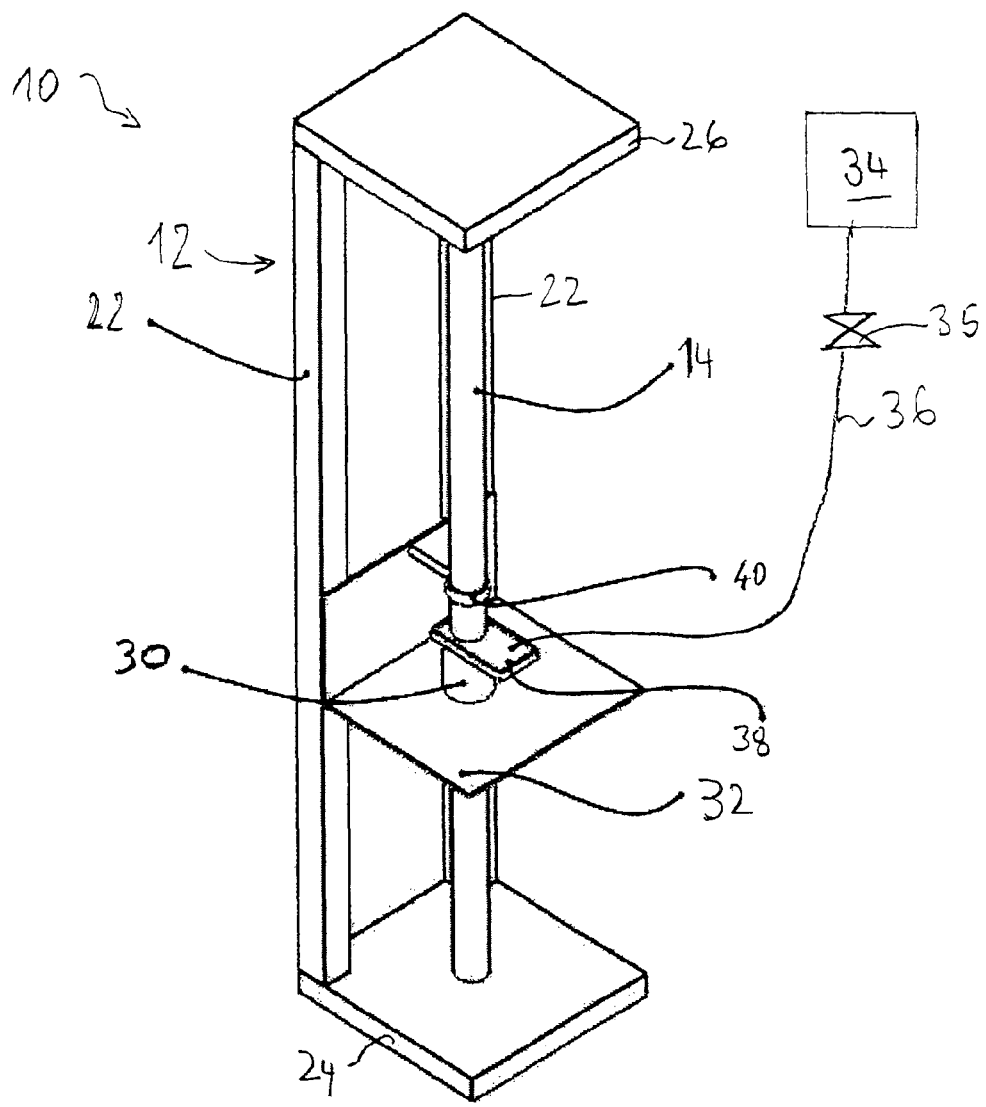
FIG. 1: is a schematic perspective view of an embodiment of an apparatus for implementing the present method.

FIG. 1 shows an embodiment of an apparatus 10 for carrying out a preferred variant of the present process for manufacturing a rotatable sputtering target.

Reference sign 12 generally indicates a frame structure that vertically holds a backing tube 14, on which a layer of material is to be deposited. In the field of sputtering, such backing tube 14 is also referred to as cylindrical target holder and the material to be deposited thereon and that will form the target in the magnetron sputtering process is called target material.

Figure 2:
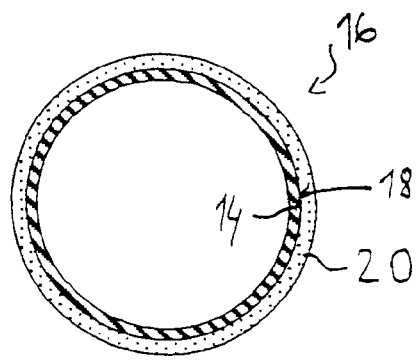
FIG. 2: is a cross-sectional view through a rotatable sputtering target obtained by the present method.

FIG. 2 shows in cross-section the rotatable sputtering target 16 obtained by the present process that thus comprises the cylindrical target holder having its outer surface 18 covered with a layer of target material 20.

The target holder 14 is advantageously made from a material having a melting temperature significantly greater than that of the target material. The choice of material thus depends on the target material, but stainless steel, copper, aluminium or alloys thereof may typically be employed. For classical glass coating applications, the target material may be a metal or alloy having a low melting point, for example zinc, tin, indium, bismuth or alloys of such metals.

Turning back to FIG. 1, the frame 12 provides a support structure on which the target holder 14 can be vertically fixed during the casting of the target material thereabout. The frame structure 12 comprises a pair of vertical columns 22 that extend between a bottom plate 24 and a top plate 26. The fixing means for the target holder 14 are not shown.

In the present embodiment, the casting is carried out by means of a mould 30 having a small axial dimension as compared to the length of the target holder 14 and that is caused to travel along the target holder 14 to progressively cast the molten target material along the target holder.

The mould 30 preferably takes the form of a sleeve member surrounding the target holder 14. Its internal diameter is dimensioned to form a layer 20 of target material of desired wall thickness on the surface 18 of the target holder 14.

The mould 30 is supported by a driving structure comprising a table 32 that is slideably engaged in the pair of columns 22. Driving means (not shown) allow translating the table 32 from the bottom plate 24 to the top plate 26 in a coaxial manner with the target holder 14 and at a controllable speed.

For a precise control of speed and position, the driving means may comprise an electric stepper motor.

Molten material is fed to the mould 30 via a feed line comprising a heated recipient 34, a flexible conduit 36, a flow control valve 35 and a spout assembly 38. The desired metal or alloy is melted in the heated recipient 34 and flows through the flexible conduit 36 to the spout assembly 38, where the molten material is poured into the mould's 30 internal volume between the mould's inner diameter and the target holder's outer surface. The spout assembly preferably comprises an annular member surrounding the target holder and defining an annular groove 39 therein, with a plurality of pouring holes 41 circumferentially distributed around the target holder so that molten metal falls into the mould's volume (see FIG. 3). Such feed line allows a continuous supply of molten target material to the mould, as may be required under the present embodiment. Of course, manual feeding is also possible, although less interesting for industrial production.

Preferably, although not shown in the Figs., the target holder 14 is water cooled from the inside. This can easily be carried out by providing appropriate connections in the bottom 24 and top plates 26 of the frame 12. The mould 30 is also water cooled at its outer periphery. Also, an additional annular cooling device (water cooling—not shown) may be provided around the cast tube below the mould 30 to further cool the solidified target material; this may be particularly advantageous for target materials with a higher melting point and longer tubes, as this cooling avoids uncontrolled heating of the mould 30 and thus ensure a stable temperature gradient in the mould 30.

At the beginning of the process, after installation of the target holder 14, the mould 30 is placed at the bottom. The mould 30 and spout assembly 38 are preferably pre-heated. Then, as molten material is fed to the mould 30, the latter is progressively vertically (axially) translated along the target holder 14 so as to cast the layer of target material 20 thereabout.

As it will be understood, in the initial position of the mould 30 on the bottom plate 24, the annular opening at the bottom of the mould 30 is preferably closed by an annular plug. As soon as the cast target material will have solidified in this region, the need for such plug will no longer be necessary since the control of the mould position can be carried out so that the already cast and solidified target layer forms such plug at the bottom of the mould 30.

In a preferred embodiment, the casting is carried out in a substantially continuous manner. Operating parameters are controlled so that while the mould 30 progresses along the target holder 14, the metal solidifies in the bottom region of the mould 30 but remains molten in the upper region of the mould 30. This can be achieved by an adequate control of the vertical speed of the mould 30, feed temperature of the molten metal, cooling of the target holder 14.

Such operating mode is more safely performed with a partial filling of the mould 30, typically by about 80% (of the volume between the mould inner diameter and outer surface of the target holder).

Figure 3:
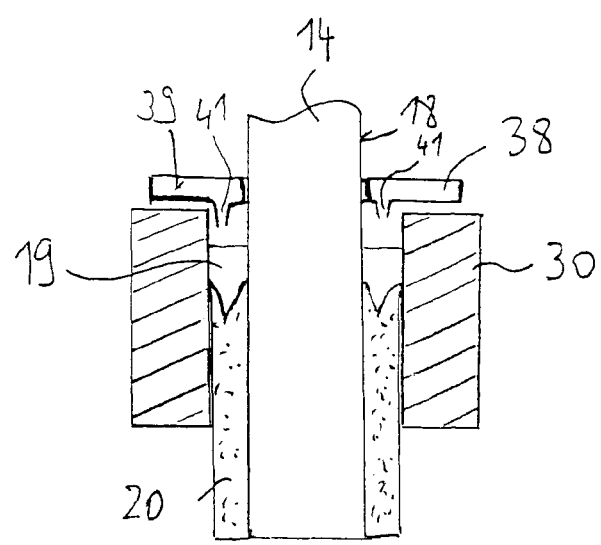
FIG. 3: is a sketch of the filled mould and target holder, viewed in cross-section, illustrating the solidification principle in the continuous casting mode of the present method.

The solidification process is illustrated in FIG. 3. Here the mould has already started its ascension towards the top plate 26. Target material is solidified around the target holder. While the mould is continuously translated upwards, molten metal is continuously supplied to the spout 38 and enters the mould. At a given moment in time, fresh molten material is liquid in the top mould region (indicated 19), while the previously poured material has solidified in the lower region of the mould 30. The mould 30 and target holder 14 being internally cooled, the cast material first solidifies at the interfaces, and further towards the centre of the metal layer. This is explains the V shaped of the solidification front.

In order to operate in this manner over the whole length of the target holder, an equilibrium is to be found between the parameters such as feed flow of molten material, feed temperature of molten material, translation speed and cooling temperatures so that the solidification front (interface liquid/solid) of the target material progresses at the somewhat the same speed as the mould speed.

As it will be understood by those skilled in the art, such mode of operation will form a continuous layer of target material 20 in a homogeneous way. It is preferred to a section by section operating mode where the mould 30 is completely filled with molten material, allowed to solidify over the entire axial extent of the mould, and then moved to the next section to repeat the casting/solidifying steps.

To avoid possible blocking problems of the mould due to the solidification of the cast metal/alloy and surface defects, the mould 30 may be rotated about itself as it travels along the target holder 14. Alternatively, the mould 30 may be subjected to an axially reciprocating movement of small amplitude (a few mm) and low frequency (a few cycles per minute). This can be done by moving the mould 30 with respect to table 32 using an appropriate reciprocating mechanism that is mounted on the latter. Of course, such rotating or reciprocating movement combines with the translating motion of the table 32 relative to the target holder 14.

Reference sign 40 indicates a temperature sensor also fixed to the table 32 for measuring the temperature of the molten target material fed into the mould 30.

To avoid water condensation above the mould 30, a stream of air is advantageously blown in the region of the target holder above the mould 30 and spout 38.

The present method is simple to implement and proves advantageous over static casting. Cooling of the target holder 14 is preferably adapted to provide a rapid solidification of the target material. This leads to shrinking/constriction of the target material, provides a good bonding to the target holder 14 and avoids chemical reaction between the cast material and the holder 14. Fast cooling is also favourable for a fine grain structure.

Example

A stainless tube having a diameter of 133 mm and length of 2.4 m was coated with a layer of 15.75 mm in accordance with the present process.

The table 32 was translated along the target holder at a speed of 150 mm/min. The mould itself was subjected, with respect to the table 32, to a reciprocating movement having an amplitude of a few mm at a frequency of about 2 Hz. The flow of liquid metal was controlled to maintain the mould at a filling level of 80%, with solidified material in the bottom of the mould and liquid material in its upper region.

The mould had an inner diameter of 165.1 mm and the resulting cathode target had an outer diameter of about 164.5 mm. Hence, with a constriction of about 0.5 mm, a target material layer having a wall thickness of 15.75 mm was formed.

The invention claimed is:

1. A method for manufacturing a rotatable sputtering target, wherein molten target material is cast around a cylindrical target holder in order to form a layer of target material on an outer surface of said target holder characterized in that said target material is cast around said target holder by means of a mould surrounding said cylindrical target holder and axially extending over only part of the length thereof, wherein said mould is fed with molten target material while the mould is moved axially relative to the target holder so as to progressively form said layer of target material along said target holder, wherein said cylindrical target holder is cooled from the inside.

2. The method according to claim 1, wherein said mould comprises a sleeve member having an inner diameter that is adapted to the desired wall thickness of said layer of target material.

3. The method according to claim 1, wherein said target material is a low melting point metal or alloy.

4. The method according to claim 1, wherein said mould is cooled.

5. The method according to claim 1, wherein said mould is subjected to an axially reciprocating movement of low speed and frequency.

6. The method according to claim 5, wherein said mould is rotated about itself during the casting of target material.

7. The method according to claim 1, wherein said mould is rotated about itself during the casting of target material.

8. The method according to claim 1, wherein said mould is connected to a driving structure that permits to coaxially translate said mould along said target holder.

9. The method according to claim 5, wherein said mould is connected to a driving structure that permits to coaxially translate said mould along said target holder.

10. The method according to claim 1, wherein said method is controlled so that, as the mould progresses along said target holder, said molten target material fed to the mould solidifies in the rear region of the mould, while in the front region of the mould the target material remains molten.

11. The method according to claim 5, wherein said method is controlled so that, as the mould progresses along said target holder, said molten target material fed to the mould solidifies in the rear region of the mould, while in the front region of the mould the target material remains molten.

12. The method according to claim 1, wherein the feed of molten target material to said mould is controlled so that the mould is filled to up to about 70 to 90% of its volume, preferably about 80%.

13. The method according to claim 1, wherein molten target material is fed into said mould by means of a spout assembly comprising a plurality of pouring holes distributed around said target holder.

14. The method according to claim 1, wherein said target holder is arranged vertically and the relative movement between said target holder and mould occurs in the vertical direction.

15. The method according to claim 1, comprising the step of machining the formed layer of target material to provide a desired surface profile of said layer of target material and/or provide concentricity.

16. The method according to claim 1, wherein said outer surface of said target holder is treated with a bond enhancing coating before casting of said target material.

17. An apparatus for producing a rotatable sputtering target comprising:
a frame structure for maintaining a cylindrical target holder;
a mould for forming a layer of target material on the outer surface of said cylindrical target holder;
a feed line for supplying molten target material to said mould;
a structure for moving the mould relative to the target holder in a coaxial manner so as to progressively form the layer of target material along said target holder;
means for cooling said cylindrical target holder from the inside.

18. The apparatus according to claim 17, wherein said mould comprises a sleeve member having an inner diameter that is adapted to the desired wall thickness of said layer of target material.

19. The apparatus according to claim 17, comprising a spout assembly with a plurality of pouring holes distributed around said target holder for feeding said molten target material into said mould.

20. The apparatus according to claim 17, comprising a spout assembly with a plurality of pouring holes distributed around said target holder for feeding said molten target material into said mould.

* * * * *